(12) United States Patent
Matsumoto

(10) Patent No.: US 7,382,134 B2
(45) Date of Patent: Jun. 3, 2008

(54) SUPERCONDUCTING MAGNET APPARATUS FOR MRI

(75) Inventor: Takahiro Matsumoto, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 129 days.

(21) Appl. No.: 11/305,010

(22) Filed: Dec. 19, 2005

(65) Prior Publication Data

US 2006/0290351 A1    Dec. 28, 2006

(30) Foreign Application Priority Data

Jun. 22, 2005    (JP)    ............................. 2005-181996

(51) Int. Cl.
*G01V 3/00*    (2006.01)
(52) U.S. Cl. ...................................... 324/319; 335/216
(58) Field of Classification Search ................ 324/319, 324/320, 318; 335/216, 299
See application file for complete search history.

(56) References Cited

U.S. PATENT DOCUMENTS

| 6,198,371 | B1* | 3/2001 | Laskaris et al. ............. 335/299 |
| 6,246,308 | B1* | 6/2001 | Laskaris et al. ............. 335/216 |
| 7,112,966 | B2* | 9/2006 | Motoshiromizu et al. ... 324/319 |
| 2004/0251901 | A1 | 12/2004 | Munetaka et al. |

* cited by examiner

*Primary Examiner*—Louis M Arana
(74) *Attorney, Agent, or Firm*—Buchanan Ingersoll & Rooney PC

(57) ABSTRACT

In a superconducting magnets for MRI configured to generate a homogeneous magnetic field and a gradient magnetic field in a space between a top superconducting magnet and a bottom superconducting magnet, the bottom superconducting magnet is provided with a supporting member that supports a helium vessel, and the supporting member is fixed to a vacuum vessel of the bottom superconducting magnet at one end, and is fixed to the floor surface in the vicinity of the end fixed to the vacuum vessel. A high-quality MR image can be thus obtained by preventing direct transmission of oscillation of the gradient coils to the superconducting magnet and reducing oscillation of the gradient coils while achieving a reduction of the overall superconducting magnet in size.

16 Claims, 11 Drawing Sheets

SUPERCONDUCTING MAGNET APPARATUS FOR MRI

BACKGROUND OF THE INVENTION

1. Field of the Invention

The present invention relates to an apparatus used to obtain a satisfactory tomographic image by preventing fluctuation of a main magnetic field caused by oscillation of gradient coils in an open-type superconducting magnet for MRI (Magnetic Resonance Image Diagnostic Apparatus).

2. Description of Related Art

In an open-type superconducting magnet for MRI in the related art as is disclosed, for example, in JP-A-2002-52004 (paragraph [0045] and FIG. 6), a frame is provided to surround an overall superconducting magnet comprising a top superconducting magnet and a bottom superconducting magnet placed one on the other, and supporting members are provided to penetrate through holes made at the centers of the top superconducting magnet and the bottom superconducting magnet. One end of the supporting member is fixed to the frame and the other end is attached to the central portion of the gradient coil for fixing the gradient coil.

The open-type superconducting magnet for MRI comprises a pair of annular superconducting magnets provided one on the other, and generates a spherical magnetic field space measuring about 40 to 50 cm across having homogeneity of several ppm and a magnetic field strength of about 0.5 to 1 tesla almost at the center of a space between the superconducting magnets. Also, a pair of gradient coils that generates a pulsed gradient magnetic field in the highly homogeneous magnetic field space is attached to the end faces on the center side of the respective superconducting magnets. However, because the gradient coils are present between a pair of the annular superconducting magnets as described above and generate a pulsed magnetic field in a strong static magnetic field, they are susceptible to a large electromagnetic force and induce mechanical oscillation. The oscillation is transmitted to the superconducting magnets, which causes a distance between a pair of the superconducting magnets to vary and thereby gives rise to minute magnetic field oscillation. This results in a phenomenon that an MR image (Magnetic Resonance Image) is deteriorated.

The open-type superconducting magnet apparatus for MRI in the related art disclosed in the cited reference is configured as described above, so that mechanical oscillation induced in the gradient coils will not come into direct contact with a pair of the superconducting magnets. Oscillation transmitted to the superconducting magnets can be therefore reduced. However, because the need to provide a large frame to surround the superconducting magnets and the incapability of effectively fixing the outer peripheral portion of the gradient coils where the largest electromagnetic force is generated due to the structure for supporting the gradient coils only at the center, the open-type superconducting magnet apparatus for MRI in the related has a problem that oscillation and noise of the gradient coils are increased.

SUMMARY OF THE INVENTION

The invention was devised to solve these problems, and therefore has an object to obtain a high-quality MR image by preventing direct transmission of oscillation of the gradient coils to the superconducting magnets and reducing oscillation of the gradient coils while achieving a reduction of the overall superconducting magnet in size.

A superconducting magnet apparatus for MRI of the invention includes: a top superconducting magnet and a bottom superconducting magnet placed spaced apart one on the other, each including a superconducting coil group formed of plural superconducting coils, a helium vessel that accommodates the superconducting coil group, a vacuum vessel that accommodates the helium vessel and provides vacuum insulation by maintaining an interior under vacuum, and a heat shield that is provided in a space between the helium vessel and the vacuum vessel to block off radiation heat from the vacuum vessel; a connection portion that connects integrally the top superconducting magnet and the bottom superconducting magnet; and a pair of gradient coils provided, respectively, to opposing inner surfaces of the top superconducting magnet and the bottom superconducting magnet to generate a gradient magnetic field. The superconducting magnet apparatus for MRI generates a homogeneous magnetic field and a gradient magnetic field in a space between the top superconducting magnet and the bottom superconducting magnet. The bottom superconducting magnet is provided with a supporting member that supports the helium vessel of the bottom superconducting magnet connected integrally to the helium vessel of the top superconducting magnet via the connection portion. The supporting member is fixed to the vacuum vessel of the bottom superconducting magnet at one end, and is fixed to a floor surface in a vicinity of the end fixed to the vacuum vessel.

According to the invention, the bottom superconducting magnet is provided with the supporting member that supports the helium vessel of the bottom superconducting magnet connected integrally to the helium vessel of the top superconducting magnet via the connection portion. The supporting member is fixed to the vacuum vessel of the bottom superconducting magnet at one end, and is fixed to the floor surface in the vicinity of the end fixed to the vacuum vessel. This eliminates a supporting member to support the helium vessel from the vacuum vessel of the top superconducting magnet. Hence, oscillation of the gradient coil attached to the vacuum vessel is not directly transmitted to the helium vessel in the top superconducting magnet, and oscillation of the magnetic field can be reduced. It is thus possible to obtain a high-quality MR image.

DESCRIPTION OF THE PREFERRED EMBODIMENTS

First Embodiment

A first embodiment of the invention will now be described with reference to FIG. 1.

Figure 1:
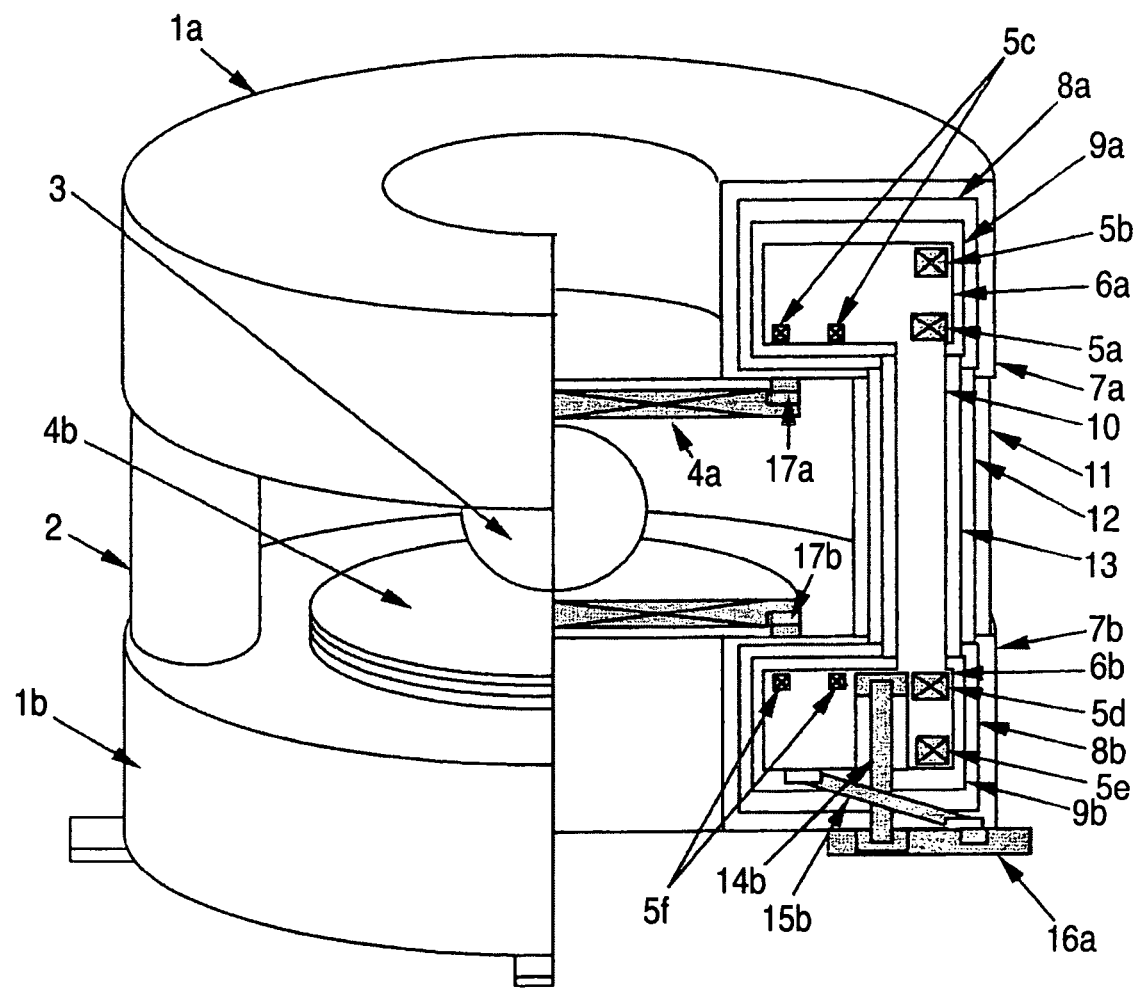
FIG. 1 is a sectional side elevation showing a first embodiment of the invention.

Referring to FIG. 1, alpha-numerals 1a and 1b denote, respectively, a top superconducting magnet and a bottom. superconducting magnet of an almost annular shape placed spaced apart one above the other, and numeral 2 denotes a connection portion that connects the top superconducting magnet 1a and the bottom superconducting magnet 1b. The top superconducting magnet 1a and the bottom superconducting magnet 1b make a pair and generate a highly homogeneous and stable static magnetic field 3 in a space at the center. Gradient coils 4a and 4b are attached, respectively, to the end faces on the center side of the top superconducting magnet 1a and the bottom superconducting magnet 1b, and they make a pair to generate a gradient magnetic field in the highly homogeneous static magnetic field space.

The internal structure of the top superconducting magnet 1a and the bottom superconducting magnet 1b is as follows. Alpha-numeral 5a denotes a main superconducting coil that chiefly generates a main magnetic field. Alpha-numeral 5b denotes a shield superconducting coil that chiefly generates a magnetic field in a direction opposite to the direction of the main superconducting coil 5a for reducing a leakage magnetic field spreading to the outside of the superconducting magnet by canceling out the magnetic field chiefly generated by the main superconducting coil 5a at the outside of the superconducting magnet. Alpha-numeral 5c denotes one or more adjusting superconducting coils that adjust a magnetic field space at the center to be a highly homogeneous magnetic field space together with the main superconducting coil 5a and the shield superconducting coil 5b.

In the bottom superconducting magnet 1b, too, superconducting coils 5d, 5e, and 5f that make pairs with the counterparts in the top superconducting magnet 1a are provided, so that the top superconducting magnet 1a and the bottom superconducting magnet 1b make a pair and generate a highly homogeneous magnetic field space 3 of a spherical shape measuring about 40 cm to 50 cm across and having homogeneity of several ppm in a space between these two superconducting magnets. Time fluctuation of the homogeneous magnetic field space 3 is required to be 0.1 ppm or less, and a high-quality MR image cannot be obtained unless this requirement is satisfied.

The superconducting coils 5a, 5b, and 5c are accommodated in a helium vessel 6a at the top, and the superconducting coils 5d, 5e, and 5f are accommodated in a helium vessel 6b at the bottom.

The helium vessel 6a at the top is accommodated in a vacuum vessel 7a in which the interior is maintained under vacuum for vacuum insulation. Further, a space between the helium vessel 6a and the vacuum vessel 7a is surrounded by a heat shield 8a that chiefly blocks off radiation heat from the vacuum vessel 7a and a heat shield 9a that is provided on the inner side of the heat shield 8a to block off radiation heat from the heat shield 8a.

As with the helium vessel 6a at the top, the helium vessel 6b at the bottom is accommodated in a vacuum vessel 7b and surrounded by heat shields 8b and 9b.

The helium vessels 6a and 6b at the top and the bottom are connected integrally by means of a tubular connection portion 10.

Likewise, the vacuum vessels 7a and 7b at the top and the bottom, the heat shields 8a and 8b, and the heat shields 9a and 9b are connected integrally by means of connection portions 11, 12, and 13, respectively.

The superconducting magnets are configured as has been described, and the helium vessels are filled with liquid helium (not shown). The superconducting coils are cooled with liquid helium to maintain a superconducting state.

Alpha-numeral 14b denotes a vertical direction supporting member made of a material having a low heat conductivity that supports the helium vessel 6b against a force in the vertical direction. The supporting member 14b is provided to three or four points for the helium vessel 6b. The top end of the supporting member 14b fixes one end of a pipe-shaped member to a concave portion provided in the bottom surface of the helium vessel 6b at the bottom, and the other end to the bottom surface of the vacuum vessel 7b.

Alpha-numeral 15b is a radius direction supporting member made of a material having a low heat conductivity that supports the helium vessel 6b against forces in the radius direction and in the circumferential direction. The supporting member 15b is provided in a space between the bottom surface of the helium vessel 6b and the bottom surface of the vacuum vessel 7b. One end thereof is fixed to the bottom surface of the helium vessel 6b at the bottom and the other end is fixed to the bottom surface of the vacuum vessel 7b so as to support the helium vessel 6b against a force in the radius direction and a rotating force with respect to the rotating shafts of the annular helium vessels acting on the helium vessels 6a and 6b.

A fixing plate 16a that fixes the vacuum vessel 7b onto the floor surface is provided in the vicinity of the supporting members 14b and 15b at portions fixed to the vacuum vessel 7b, and it is fixed to the floor surface to suppress oscillation.

The gradient coils 4a and 4b are fixed to flange surfaces of the vacuum vessels 7a and 7b via elastic bodies 17. Although it is not shown in the drawing, the gradient coils 4a and 4b are connected to gradient power supplies that feed a pulsed current.

Other components needed to obtain an MR image, such as a high frequency coil and high frequency transmitter and receiver to transmit or receive a high frequency radio wave, and a bed for a patient to lie on, are also provided.

Operations will now be described.

In the first embodiment, the top superconducting magnet 1a and the bottom superconducting magnet 1b generate a magnetic field having 0.5 to 1 T and a magnetic flux in the vertical direction at an intermediate portion between the top superconducting magnet 1a and the bottom superconducting magnet 1b. The magnetic field thus generated makes the magnetic field space 3 of a spherical or elliptical shape measuring about 40 to 50 cm across a highly homogeneous magnetic field having homogeneity of several ppm.

The gradient coils 4a and 4b provided near the inner end faces of the top superconducting magnet 1a and the bottom superconducting magnet 1b generate a pulsed gradient magnetic field with a slew rate of 20 mT/sec and a rise rate of 50 to 80 mT/m/sec in the highly homogeneous magnetic field space 3. Also, the gradient coils 4a and 4b are disposed in magnetic fields generated by the top superconducting magnet 1a and the bottom superconducting magnet 1b. When a current of several hundreds A passes through the gradient coils 4a and 4b, electromagnetic forces of several hundreds kg are induced in the gradient coils, which gives rise to oscillation. It should be noted, however, that the gradient coils 4a and 4b induce electromagnetic forces in directions opposite to each other.

Because the gradient coils 4a and 4b are fixed to the end faces on the intermediate side of the vacuum vessels 7a and 7b via the elastic bodies 17, oscillation thus induced is attenuated to some extent and then transmitted to the vacuum vessel 7b.

The helium vessel 6a at the top, in which the superconducting coils 5a, 5b, and 5c of the top superconducting magnet 1a are accommodated, is attached integrally to the helium vessel 6b at the bottom by means of the connection portion 10. Meanwhile, because the helium vessel 6a at the top is not supported on the vacuum vessel 7a at the top by means of a supporting member, they are mechanically isolated. As a consequence, oscillation of the gradient coil 4a at the top is not directly transmitted to the helium vessel 6a at the top.

The helium vessel 6b at the bottom is fixed to the vacuum vessel 7b at the bottom by means of the vertical direction supporting member 14b and the radius direction supporting member 15b. Points at which the vertical direction supporting member 14b and the radius direction supporting member 15b are fixed to the vacuum vessel 7b at the bottom are fixed to portions in the vicinity of the fixing plate 16a that is fixed to the basis. Oscillation of the gradient coils 4a and 4b transmitted to the vacuum vessel 7b is reduced because the fixing plate 16a is fixed to the basis. This suppresses oscillation transmitted to the helium vessel 6b supported in the vicinity of the fixing plate 16a.

It is thus possible to reduce a quantity of change of relative positions of the superconducting coils 5a, 5b, and 5c and the superconducting coils 5d, 5e, and 5f caused by oscillation of the gradient coils 4a and 4b, which in turn makes it possible to obtain a high-quality MR image.

Second Embodiment

The gradient coils 4a and 4b are attached to flat planes on the inner end faces of the superconducting magnets 1a and 1b via the buffers 17 in the first embodiment above. However, the same advantages can be expected by providing concave portions 17c and 17d in the superconducting magnets 1a and 1b and disposing gradient coils 4c and 4d within the concave portions 17c and 17d as is shown in FIG. 2.

A second embodiment of the invention will now be described with reference to FIG. 2.

Figure 2:
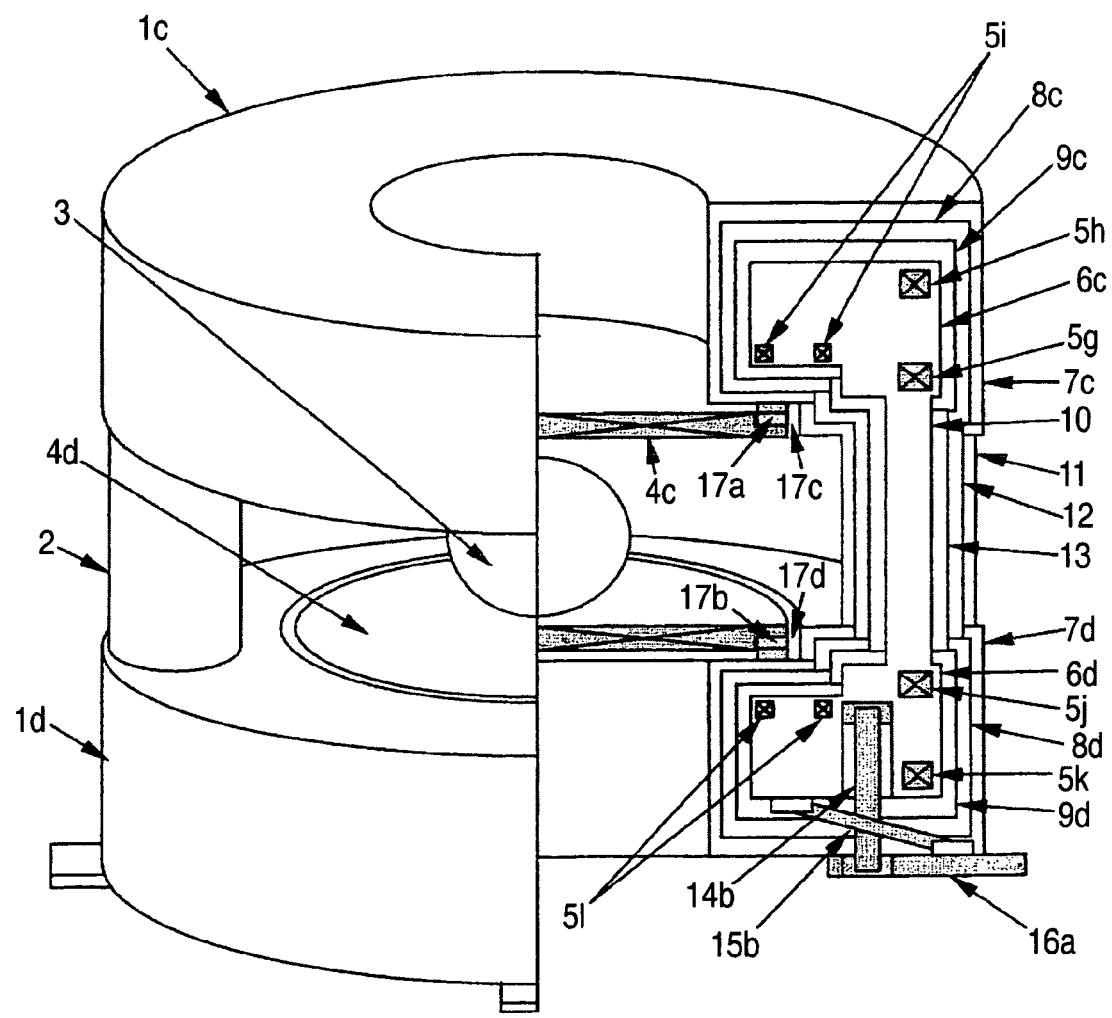
FIG. 2 is a sectional side elevation showing a second embodiment of the invention.

Referring to FIG. 2, alpha-numerals 1c and 1d denote a top superconducting magnet and a bottom superconducting magnet of an almost annular shape, and numeral 2 denotes a connection portion that connects the top superconducting magnet 1c and the bottom superconducting magnet id. The top superconducting magnet 1c and the bottom superconducting magnet 1d make a pair and generate a highly homogeneous and stable static magnetic field 3 in a space at the center. Gradient coils 4c and 4d are attached, respectively, to the end faces on the center side of the top superconducting magnet 1c and the bottom superconducting magnet id, and they make a pair to generate a gradient magnetic field in the highly homogeneous static magnetic field space.

The internal structure of the top superconducting magnet 1c and the bottom superconducting magnet 1d is as follows. Alpha-numeral 5g denotes a main superconducting coil that chiefly generates a main magnetic field. Alpha-numeral 5h denotes a shield superconducting coil that chiefly generates a magnetic filed in a direction opposite to the direction of the main superconducting coil 5a for reducing a leakage magnetic field spreading to the outside of the superconducting magnet by canceling out the magnetic field generated by the main superconducting coil 5g at the outside of the superconducting magnet. Alpha-numeral 5i denotes one or more than one adjusting superconducting coils that adjust a magnetic field space at the center to be a highly homogeneous magnetic field space together with the main superconducting coil 5g and the shield superconducting 5h.

The main superconducting coil 5g has a diameter slightly larger than normal and is disposed in such a manner that a dimension between the main superconducting coils 5g and 5j becomes shorter. A concave portion 17a is provided to a helium vessel 6c, heat shields 8c and 9c, and a vacuum vessel 7c to go inside the main superconducting coil 5g, and the gradient coil 4c is disposed to fit in the concave portion 17a.

In the bottom superconducting magnet 1d, too, superconducting coils 5j, 5k, and 5l that make pairs with the counterparts of the top superconducting magnet 1c are disposed in the same manner. A concave portion 17d is provided to a helium vessel 6d, heat shields 8d and 9d, and a vacuum vessel 7d to go inside the main superconducting coil 5j, and the gradient coil 4d is disposed to fit in the concave portion 17b.

The top superconducting magnet 1c and the bottom superconducting magnet 1d make a pair and generate a highly homogeneous magnetic field space 3 of a spherical shape measuring 40 cm to 50 cm across and having homogeneity of several ppm in a space between these two superconducting magnets.

The superconducting coils 5g, 5h, and 5i and the superconducting coils 5h, 5k, and 5l are accommodated, respectively, in the helium vessels 6c and 6d and are cooled with liquid helium (not shown) to maintain a superconducting state.

The helium vessel 6c is accommodated in the vacuum vessel 7c in which the interior is maintained under vacuum for vacuum insulation. Further, a space between the helium vessel 6c and the vacuum vessel 7c is surrounded by the heat shield 8c that chiefly blocks off radiation heat from the vacuum vessel 7c and the heat shield 9c that is provided on the inner side of the heat shield 8c to block off radiation heat from the heat shield 8c.

As with the helium vessel 6c at the top, the helium vessel 6d at the bottom is accommodated in the vacuum vessel 7d and surrounded by the heat shields 8d and 9d.

The helium vessels 6c and 6d at the top and the bottom are connected integrally by means of a tubular connection portion 10.

Likewise, the vacuum vessels 7c and 7d at the top and the bottom, the heat shields 8c and 8d, and the heat shields 9c and 9d are connected integrally by means of connecting portions 11, 12, and 13, respectively.

Alpha-numeral 14b denotes a vertical direction supporting member made of a material having a low heat conductivity that supports the helium vessel 6d in the vertical direction. The supporting member 14b is provided to three or four points for the helium vessel 6d. The top end of the supporting member 14b fixes one end of a pipe-shaped member to a concave portion provided in the bottom surface of the helium vessel 6d at the bottom, and the other end to the bottom surface of the vacuum vessel 7d.

Alpha-numeral 15b denotes a supporting member of the helium vessel 6d in the radius direction. The supporting member 15b is provided in a space between the bottom surface of the helium vessel 6d and the bottom surface of the vacuum vessel 7d. One end of the supporting member 15b is fixed to the bottom surface of the helium vessel 6d and the other end is fixed to the. bottom surface of the vacuum vessel 7d so as to support the helium vessel 6d against a force in the radius direction and a rotating force acting on the helium vessels 6c and 6d.

A fixing plate 16a that fixes the vacuum vessel 7d to the floor surface is provided in the vicinity of the supporting members 14b and 15b at portions fixed to the vacuum vessel 7d, and it is fixed to the floor surface to suppress oscillation.

Alpha-numerals 4c and 4d denote gradient coils that are fixed to flange surfaces of the vacuum vessels 7c and 7d via elastic bodies 17a and 17b.

Although it is not shown in the drawing, the gradient coils 4c and 4d are connected to gradient power supplies that feed a pulsed current.

Other components needed to obtain an MR image (Magnetic Resonance Image), such as a high frequency coil and high frequency transmitter and receiver to transmit or receive a high frequency radio wave, and a bed for a patient to lie on, are also provided.

In the second embodiment, in the top superconducting magnet 1c and the bottom superconducting magnet 1d, the main superconducting coil 5g is disposed so that a dimension between the main superconducting coils 5g and 5j becomes shorter, and the concave portions 17c and 17d are provided to the helium vessels 6c and 6d, the heat shields 8c and 9c and the heat shields 8d and 9d, and the vacuum vessels 7c and 7d to go inside the main superconducting coils 5g and 5j, so that the gradient coils 4c and 4d are disposed to fit in the concave portions 17c and 17d. Hence, it is easy to design the placement of coils that generate a highly homogenous magnetic field space, and rigidity between the helium vessel 6c at the top and the helium vessel 6d at the bottom can be increased by shortening the connection portion 10. It is thus possible to obtain a high-quality MR image by suppressing influences of oscillation of the gradient coils as in the first embodiment.

Third Embodiment

A third embodiment of the invention will now be described with reference to FIG. 3.

Figure 3:
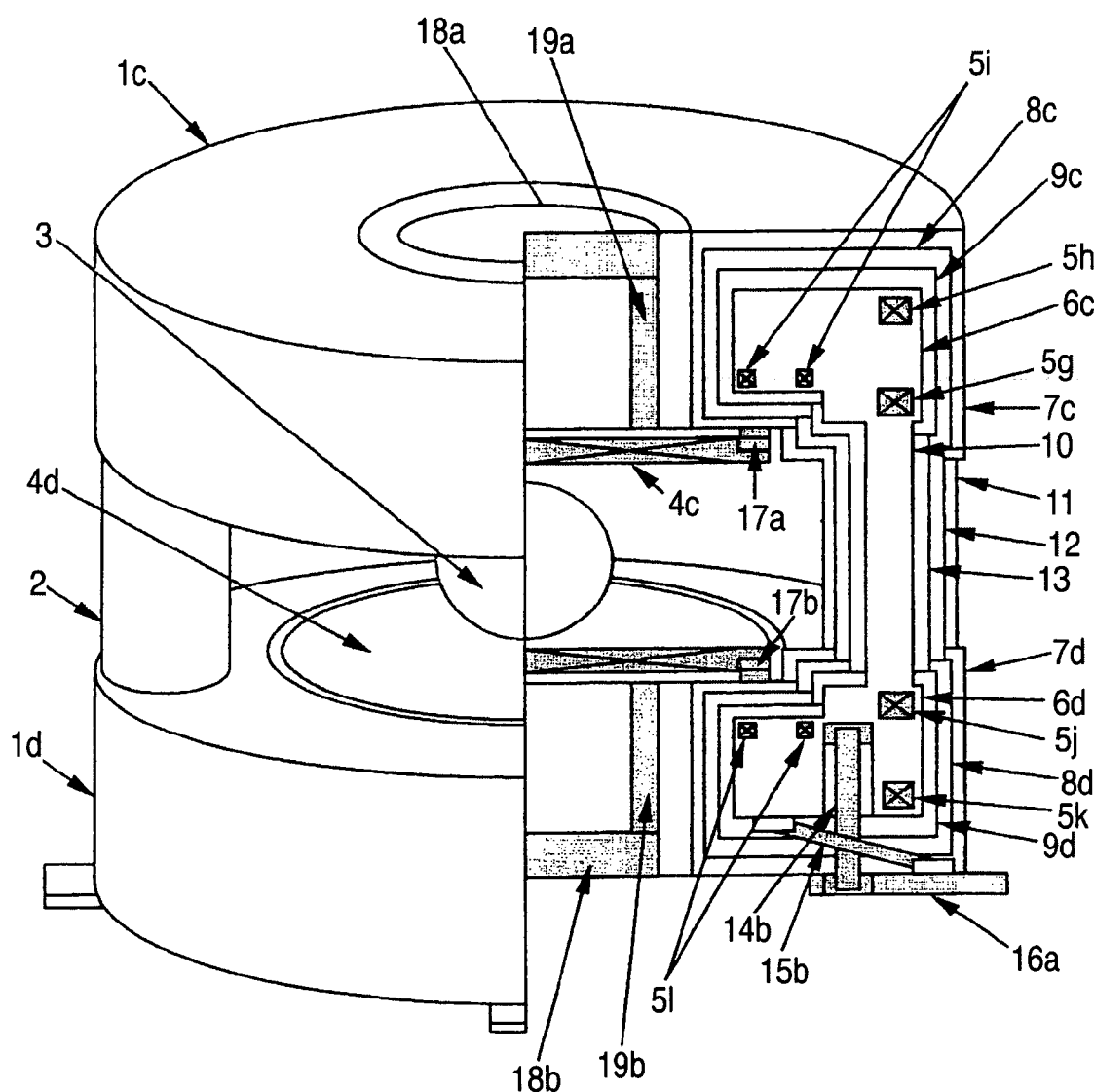
FIG. 3 is a sectional side elevation showing a third embodiment of the invention.

Referring to FIG. 3, alpha-numeral 18a denotes a mass body attached to a gradient coil 4c at the top nearly at the center via a connection member 19a using a hole at the center of the top superconducting magnet. Alpha-numeral 18b denotes a mass body attached to a gradient coil 4d at the bottom nearly at the center via a connection member 19b using a hole at the center of the bottom superconducting magnet. The mass of the mass bodies 18a and 18b is about 50 kg to 200 kg. A material of the mass bodies 18a and 18b is non-magnetic metal having a large specific gravity, for example, lead, stainless, or copper.

The other. portions are the same as or equivalent to those of the second embodiment.

In the third embodiment, the mass bodies 18a and 18b are attached to the gradient coils 4c and 4d nearly at the center. Hence, in comparison with a case in the absence of mass bodies, the mass of oscillation portions is increased, which can reduce a quantity of oscillation-induced displacement. It is thus possible to obtain a high-quality MR image by suppressing influences of oscillation of the gradient coils 4c and 4d as in the first and second embodiments.

Fourth Embodiment

A fourth embodiment of the invention will now be described with reference to FIG. 4.

Figure 4:
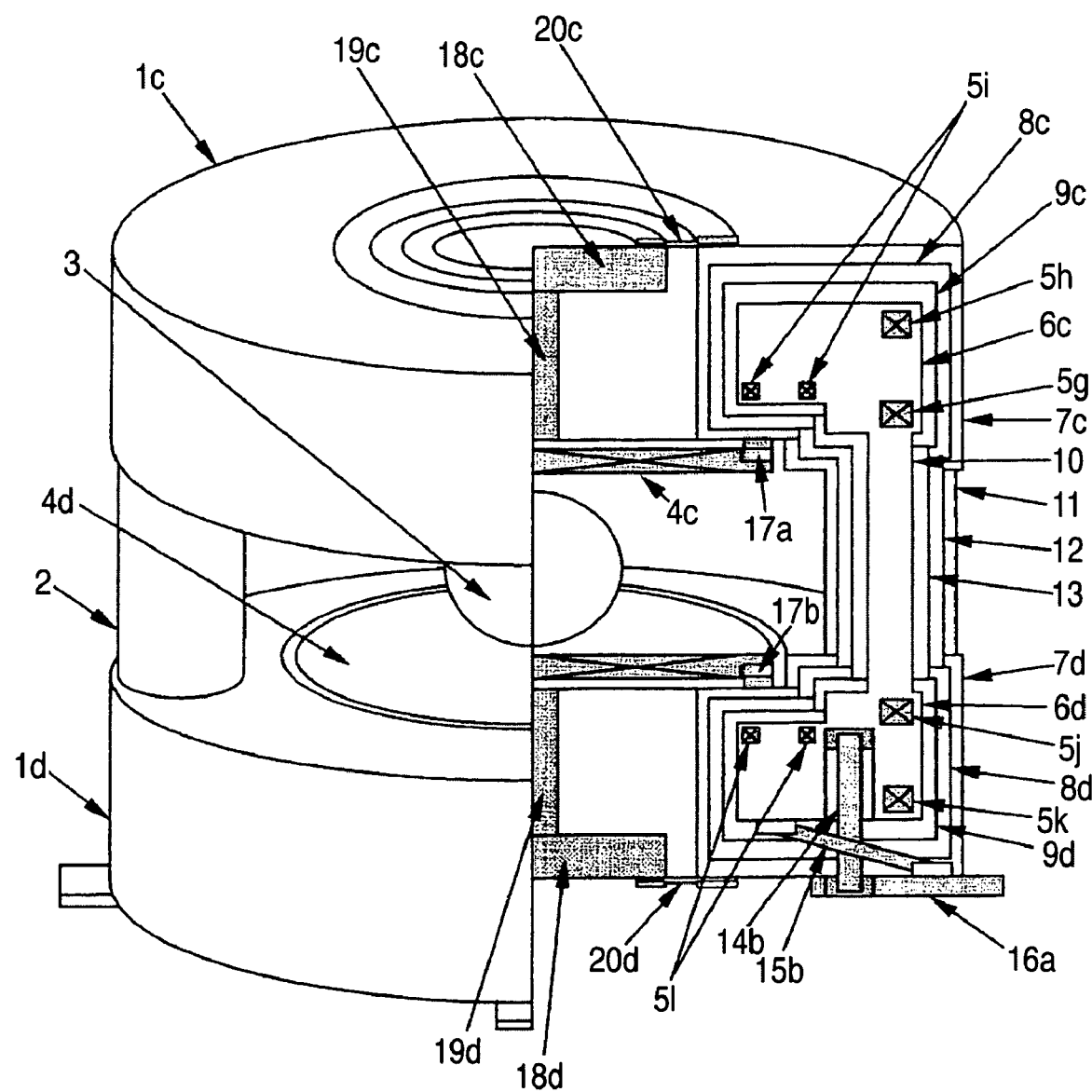
FIG. 4 is a sectional side elevation showing a fourth embodiment of the invention.

Referring to FIG. 4, alpha-numeral 18c denotes a mass body attached to a gradient coil 4c at the top nearly at the center using a hole at the center of the top superconducting magnet. Alpha-numeral 18d denotes a mass body attached to a gradient coil 4d at the bottom nearly at the center using a hole at the center of the bottom superconducting magnet. A material of the mass bodies 18c and 18d is a non-magnetic metal having a large specific gravity, for example, lead, stainless, or copper. The mass bodies 18c and 18d are fixed, respectively, to the gradient coils 4c and 4d at the ends on the center side via connection members 19c and 19d, and fixed, respectively, to vacuum vessels 7c and 7d at the other ends via elastic bodies 20c and 20d.

Although it is not shown in the drawing, a number of adjustment iron pieces are attached in a space between the holes in the superconducting magnets 1c and 1d at the center and the mass bodies 18c and 18d to enhance homogeneity of the homogenous magnetic field space generate by the superconducting magnets.

In the fourth embodiment, portions connected to the gradient coils 4c and 4d are made thinner. However, because the other ends are elastically supported on the vacuum vessels 7c and 7d, a problem that the mass bodies 18c and 18d fall or any other problem will not occur. A space is generated between the bodies of the mass bodies 18c and 18d and the bodies of the vacuum vessels 18c and 18d, and a space for providing adjustment iron pieces needed to adjust the homogeneity of the magnetic field can be secured. In addition, because the fixing portions of the mass bodies 18c and 18d on the gradient coils 4c and 4d side are thin, an oscillation-induced overcurrent magnetic field is generated less frequently, which can suppress influences of oscillation. As with the third embodiment, because the mass bodies are attached to the gradient coils 4c and 4d nearly at the center, in comparison with a case where the mass bodies 18c and 18d are absent, the mass of the oscillation portion is increased, which can reduce a quantity of oscillation-induced displacement. It is thus possible to obtain a high-quality MR image by suppressing influences of oscillation of the gradient coils as in the first embodiment.

Fifth Embodiment

Figure 5:
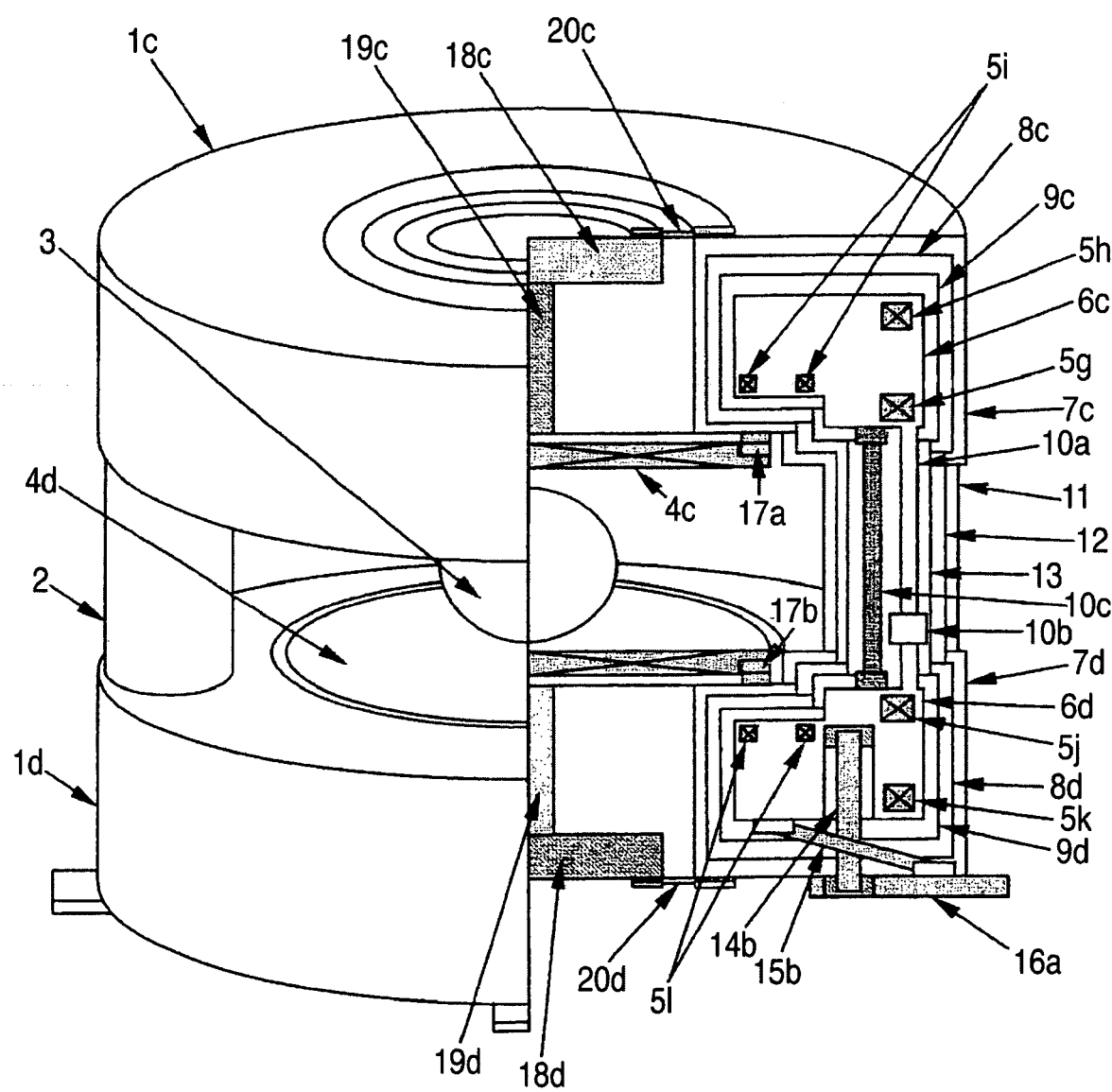
FIG. 5 is a sectional side elevation showing a fifth embodiment of the invention.

A fifth embodiment of the invention will now be described with reference to FIG. 5.

Alpha-numeral 10a denotes a gas tube through which a helium gas or liquid helium goes in or comes out from helium vessels 6c and 6d.

Alpha-numeral 10b denotes a stress absorbing member comprising a bellows or the like attached to the gas tube 10a.

Alpha-numeral 10c denotes a connection pillar that serves as a support against a force, such as a mass and electromagnetic forces acting between the helium vessels 6c and 6d. The other portions are the same as or equivalent to those of the first through fourth embodiments.

In the superconducting magnets configured as above, because the connection pillar 10c and the gas tube 10a are disposed separately, a supporting pillar having high rigidity with respect to gravity, electromagnetic forces, and oscillation acting between the helium vessel 6c at the top and the helium vessel 6d at the bottom can be designed efficiently. Also, because the gas tube 10a is connected using the stress absorbing member 10b comprising a bellows or the like, even when the gas tube 10a alone is cooled rapidly during the initial cooling of the helium vessels 6c and 6d, a large stress will not be produced between the gas tube 10a and the connection pillar 10c. When the gas tube 10a is connected by welding, the dimensional accuracy of dimensions between the superconducting coils 5g, 5h, and 5i and the superconducting coils 5j, 5k, and 5l accommodated, respectively, in the helium vessels 6c and 6d becomes poor due to heat deformation, such as contraction by welding. However, by separating the connection portion to the connection tube 10a and the connection pillar 10b, and by adopting the bolt tightening structure to the connection pillar 10c, it is possible to limit a distance between the helium vessels 6c and 6d to 1 m or less. This makes the adjustment easy when the homogeneous magnetic field space 3 is formed. It is thus possible to obtain a high-quality MR image by suppressing influences of oscillation of the gradient coils as in the first embodiment.

Sixth Embodiment

A sixth embodiment of the invention will now be described with reference to FIG. 6.

Figure 6:
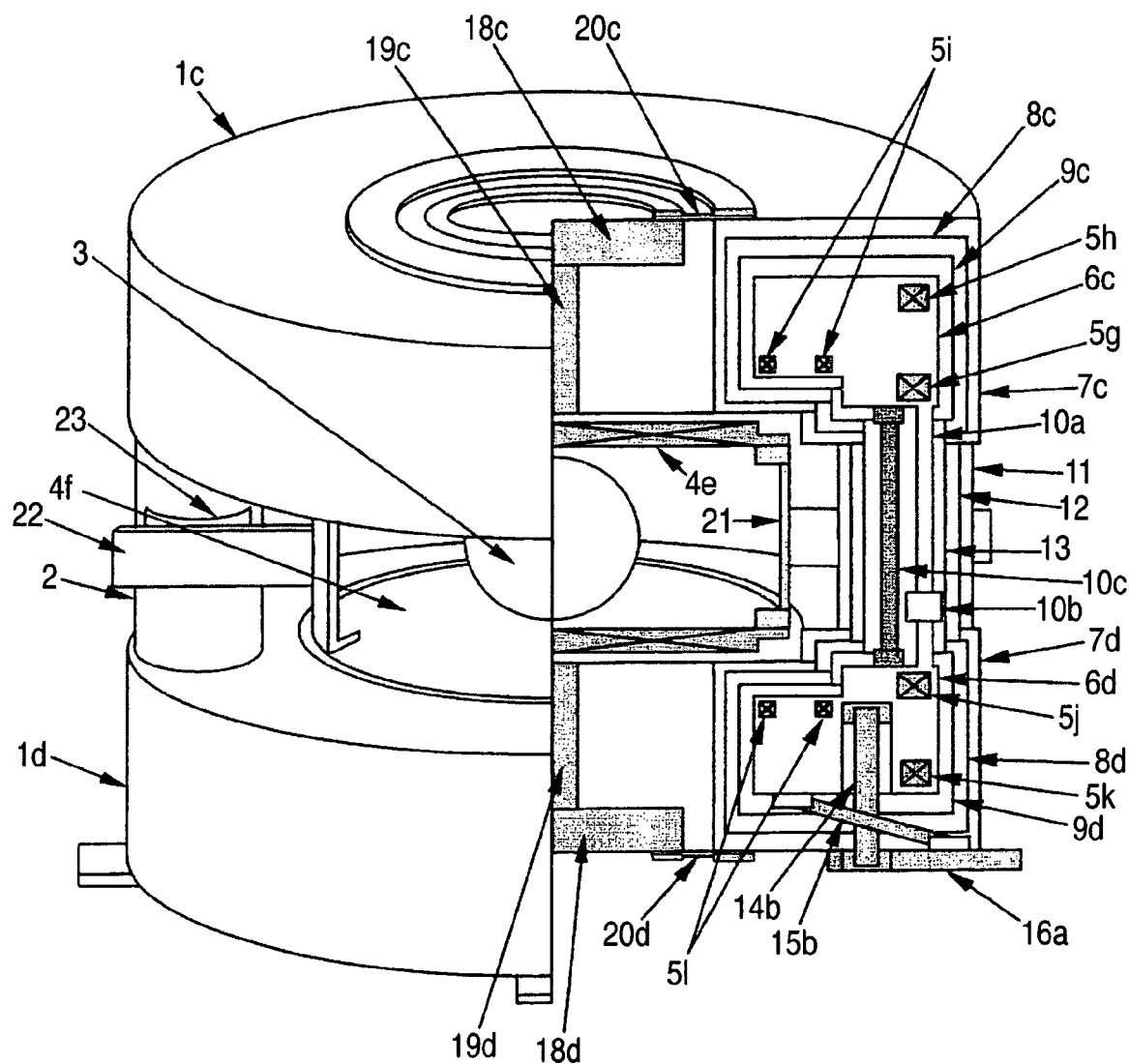
FIG. 6 is a sectional side elevation showing a sixth embodiment of the invention.

Referring to FIG. 6, numeral 21 denotes a connection member that connects gradient coils 4e and 4f. Numeral 22 denotes a beam structure member used to connect the connection member 21 and the connection portion 11 of the superconducting magnets 1c and 1d.

Numeral 23 denotes a buffer provided between the beam structure member 22 and the connection portion 11 of the superconducting magnets 1c and 1d.

The other portions are the same as or equivalent to those of the first through fifth embodiments.

In the superconducting magnets configured as above, because a current of several hundreds A passes through the gradient coils 4e and 4f in the magnetic fields generated by the respective superconducting magnets 1c and 1d, electromagnetic forces of several hundreds kg are generated. However, most of the electromagnetic forces generated by the gradient coils 4e and 4f are electromagnetic forces in directions opposite to each other in a vertical direction. The electromagnetic forces are therefore cancelled out by integrating the gradient coils 4e and 4f into a single unit by means of the connection member 21.

Hence, when the connection portion 11 of the superconducting magnets 1c and 1d is fixed to the connection member 21 nearly at the center by means of the beam structure member 22 via the buffer 23, oscillation transmitted to the vacuum vessels 7c and 7d of the superconducting magnets 1c and 1d can be reduced. It is thus possible to obtain a high-quality MR image by suppressing influences of oscillation of the gradient coils 4e and 4f as in the first embodiment.

Seventh Embodiment

A seventh embodiment will now be described with reference to FIG. 7.

Figure 7:
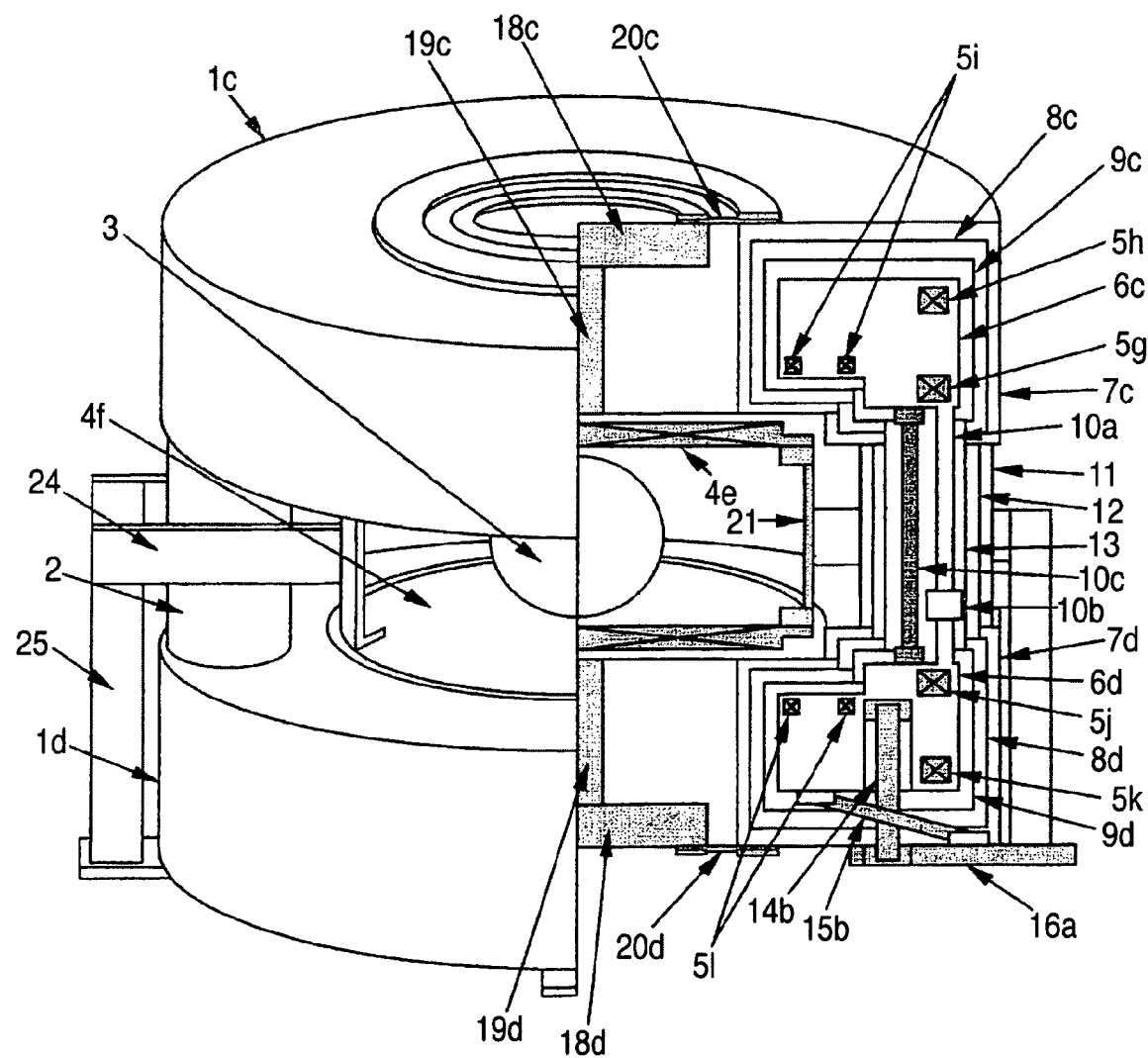
FIG. 7 is a sectional side elevation showing a seventh embodiment of the invention.

Referring to FIG. 7, numeral 21 denotes a connection member that connects gradient coils 4e and 4f.

Numeral 24 denotes a beam-shaped member attached to the connection member 21 nearly at the center.

Numeral 25 denotes a pillar attached to a fixing plate 16a of the superconducting magnet or the floor surface.

The beam-shaped member 24 is fixed to the pillar 25, and the gradient coils 4e and 4f are supported without coming into contact with the superconducting magnets 1c and 1d.

The other portions are the same as or equivalent to those of the first through sixth embodiments.

In the superconducting magnets configured as above, because a current of several hundreds A passes through the gradient coils 4e and 4f in the magnetic fields generated by the respective superconducting magnets 1c and 1d, electromagnetic forces of several hundreds kg are generated. However, most of the electromagnetic forces generated by the gradient coils 4e and 4f are electromagnetic forces in directions opposite to each other in the vertical direction. The electromagnetic forces are therefore cancelled out by integrating the gradient coils 4e and 4f into a single unit by means of the connection member 21.

Oscillation reduced by canceling out is transmitted to the pillar 25 by way of the beam-shaped member 24. Because the pillar 25 is fixed to the floor or the fixing plate 16a of the superconducting magnet having a large mass, oscillation transmitted to the pillar 25 is further reduced markedly. Meanwhile, because the superconducting magnets 1c and 1d merely come in contact with each other by way of the fixing plate 16a fixed to the floor, oscillation of the gradient coils 4e and 4f will not give rise to oscillation of the superconducting magnets 1c and 1d. Hence, oscillation-induced displacement between the superconducting coils 5g 5h and 5i at the top and the superconducting coils 5j, 5k and 5l at the bottom is small, and so is the fluctuation of the magnetic field. It is thus possible to obtain a high-quality MR image.

Eighth Embodiment

An eighth embodiment of the invention will now be described with reference to FIG. 8, FIG. 9, and FIG. 10.

Figure 8:
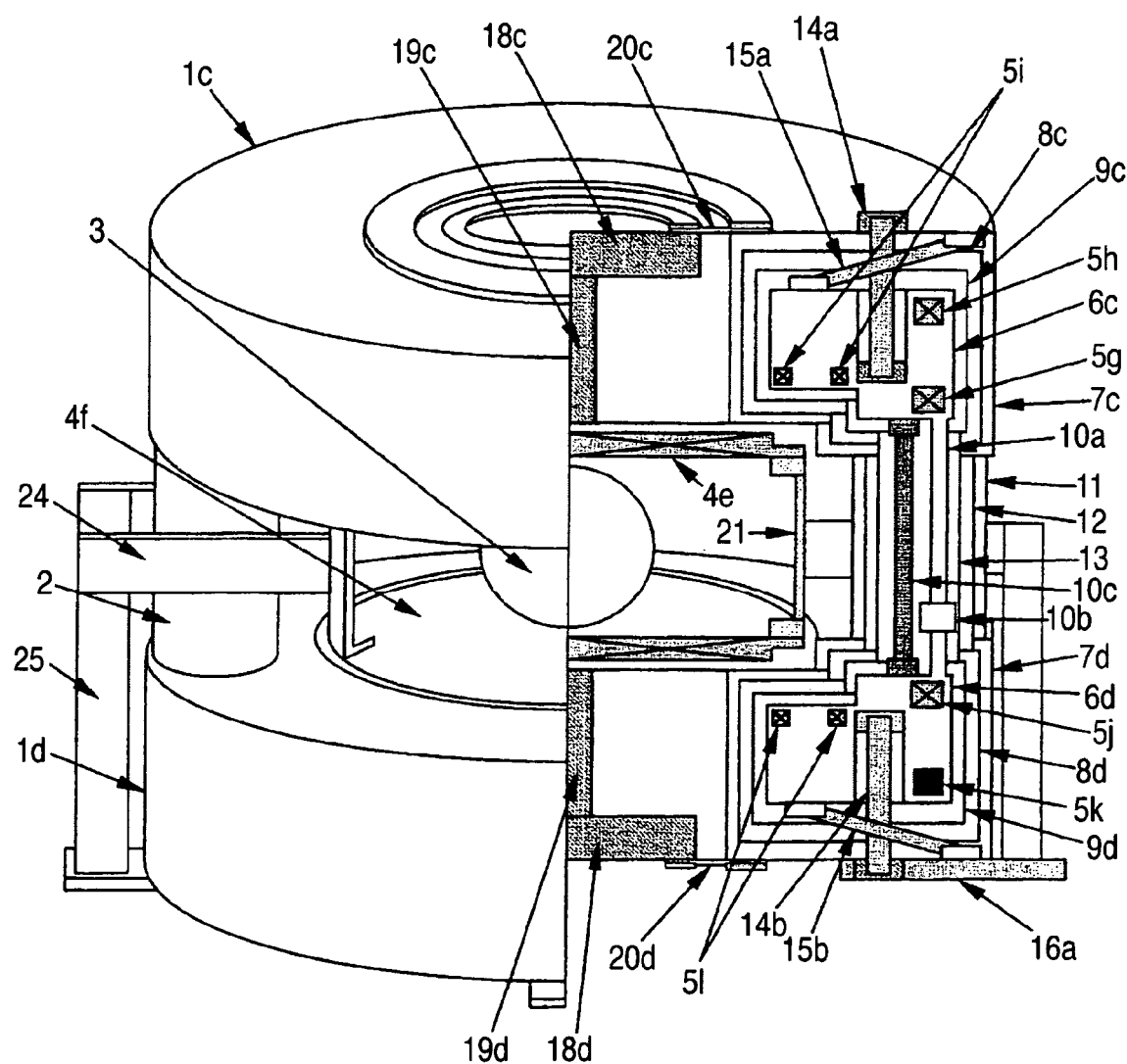
FIG. 8 is a sectional side elevation showing an eighth embodiment of the invention.

Referring to FIG. 8, alpha-numeral 14a denotes a vertical direction top supporting member made of a material having a small heat conductivity that supports the helium vessel 6c at the top against a force acting in the vertical direction.

Alpha-numeral 15a denotes a radius direction top supporting member made of a material having a small heat conductivity that supports the helium vessel 6c at the top against forces in the radius direction and the circumferential direction (a rotating direction with respect to the central axis).

Figure 9:
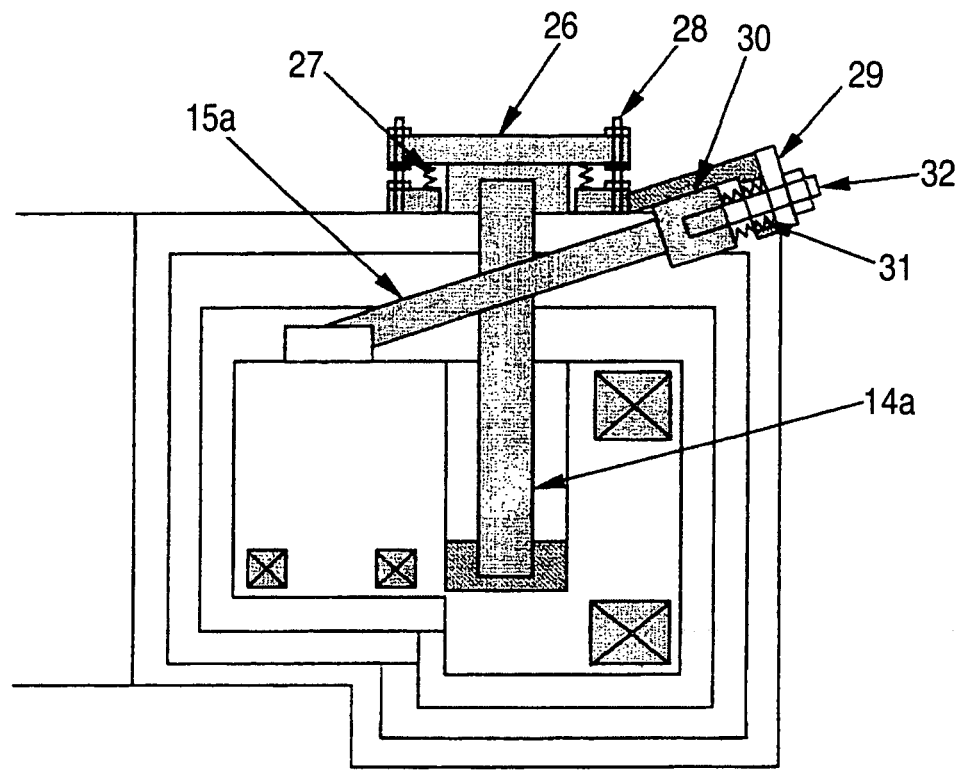
FIG. 9 is a sectional side elevation showing a major portion of the eighth embodiment.

A portion of the vertical direction top supporting member 14a fixed to a vacuum vessel 7c is configured as is shown in FIG. 9. Referring to FIG. 9, the vacuum vessel side of the vertical direction top supporting member 14a is fixed to a fixing plate 26, and a bellows 27 is provided in a space between the fixing plate 26 and the vacuum vessel 7c to maintain a vacuum.

The fixing plate 26 is of s structure by which it can be fixed or released using a bolt and nut 28 without breaking a vacuum.

The radius direction top supporting member 15a is also of a structure by which the vacuum vessel side is fixed to a fixing plate 29, and a bellows 31 are attached to a fixing fitting 30 and to a fitting on the vacuum vessel side to maintain a vacuum. In addition, it is also of a structure by which it can be fixed or released using a bolt and nut 32 at the center without breaking a vacuum.

The other portions are the same as or equivalent to those of the first through seventh embodiments.

When the superconducting magnets are transported, oscillation acceleration of about 3G or 5G is generated as oscillation during transportation. When such oscillation is to be supported by the bottom supporting members 14b and 15b, quite robust supporting members are necessary. Attachment of these components, however, may not be easy. In such a case, the helium vessel 6c at the top is supported by the vertical direction top supporting member 14a and the radius direction top supporting member 15a only during the transportation, and the bolts and nuts 28 and 32 are loosened after installation in a hospital or the like. When arranged in this manner, oscillation of the gradient coil 4e attached to the vacuum vessel 7c at the top is hardly transmitted to the helium vessels 6c and 6d and fluctuation of the magnetic field is reduced almost as in the first embodiment, which in turn makes it possible to obtain a high-quality MR image. In addition, the vacuum vessels 7c and 7d can be maintained under vacuum.

Figure 10:
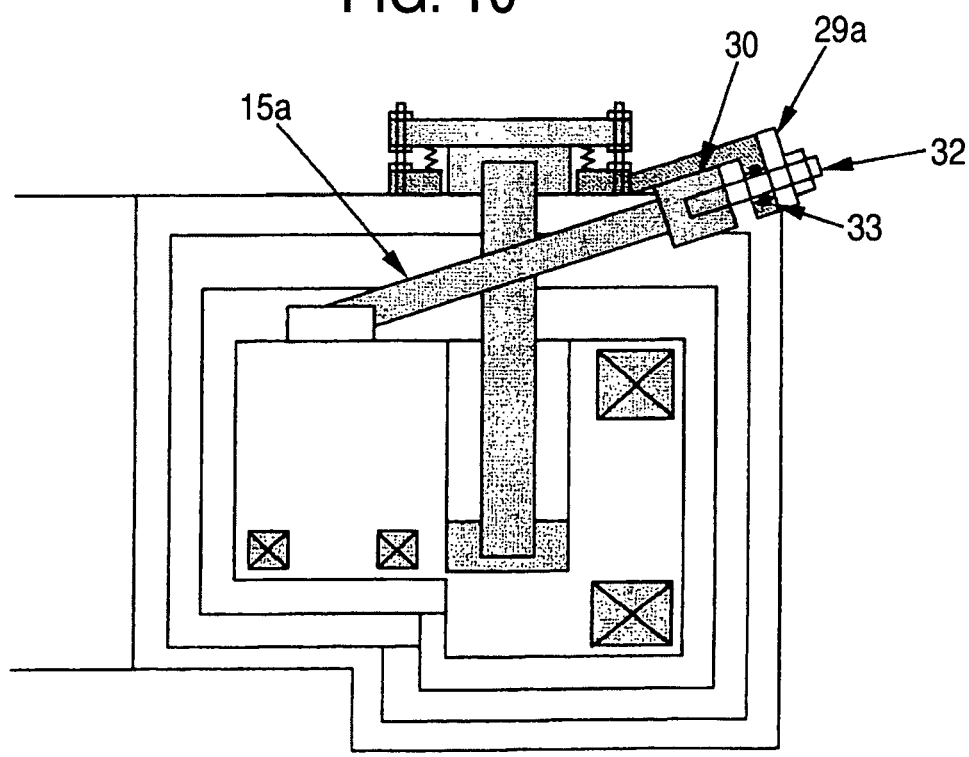
FIG. 10 is a sectional side elevation showing a modification of the eighth embodiment.

In the eighth embodiment, the radius direction top supporting member 15a can be of a structure as is shown in FIG. 10 in which the fixing bolt and nut 32 is attached on the vacuum vessel side and an O-ring 33 is attached to the fitting on the vacuum vessel side. One end of the radius direction top supporting member 15a is then made free without breaking a vacuum in the vacuum vessel.

Ninth Embodiment

A ninth embodiment of the invention will now be described with reference to FIG. 11.

Figure 11:
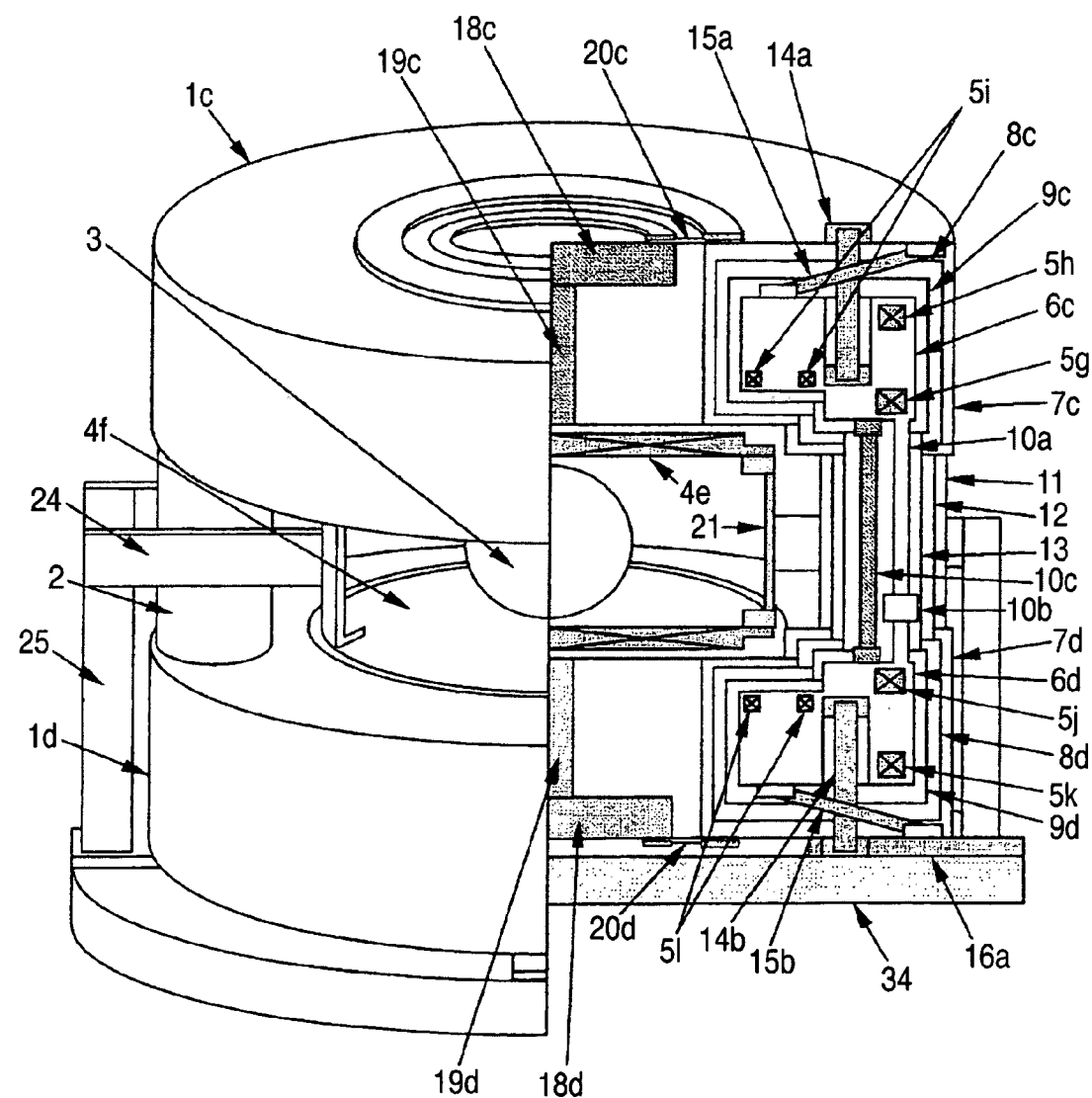
FIG. 11 is a sectional side elevation showing a ninth embodiment of the invention.

Referring to FIG. 11, numeral 34 denotes a mass body provided under the superconducting magnet.

A fixing plate 16a of the superconducting magnet is fixed to the mass body 34.

The other portions are the same as or equivalent to those of the first through eighth embodiments.

Because the fixing plate 16a of the superconducting magnet is fixed to the mass body 34, oscillation transmitted from gradient coils 4e and 4f by way of a connection member 21, a beam-shaped member 24, and a pillar 25 reaches the fixing plate 16a. Because the fixing plate 16a is fixed to the mass body 34 having a mass of about 1000 kg to 3000 kg, the oscillation thus transmitted is reduced, and oscillation to be transmitted to the superconducting magnets 1c and 1d is reduced markedly. It is thus possible to obtain a high-quality MR image by reducing oscillation between the superconducting coils 5g, 5h, and 5i at the top and the superconducting coils 5j, 5k, and 5l at the bottom.

Tenth Embodiment

A tenth embodiment of the invention will now be described with reference to FIG. 12.

Figure 12:
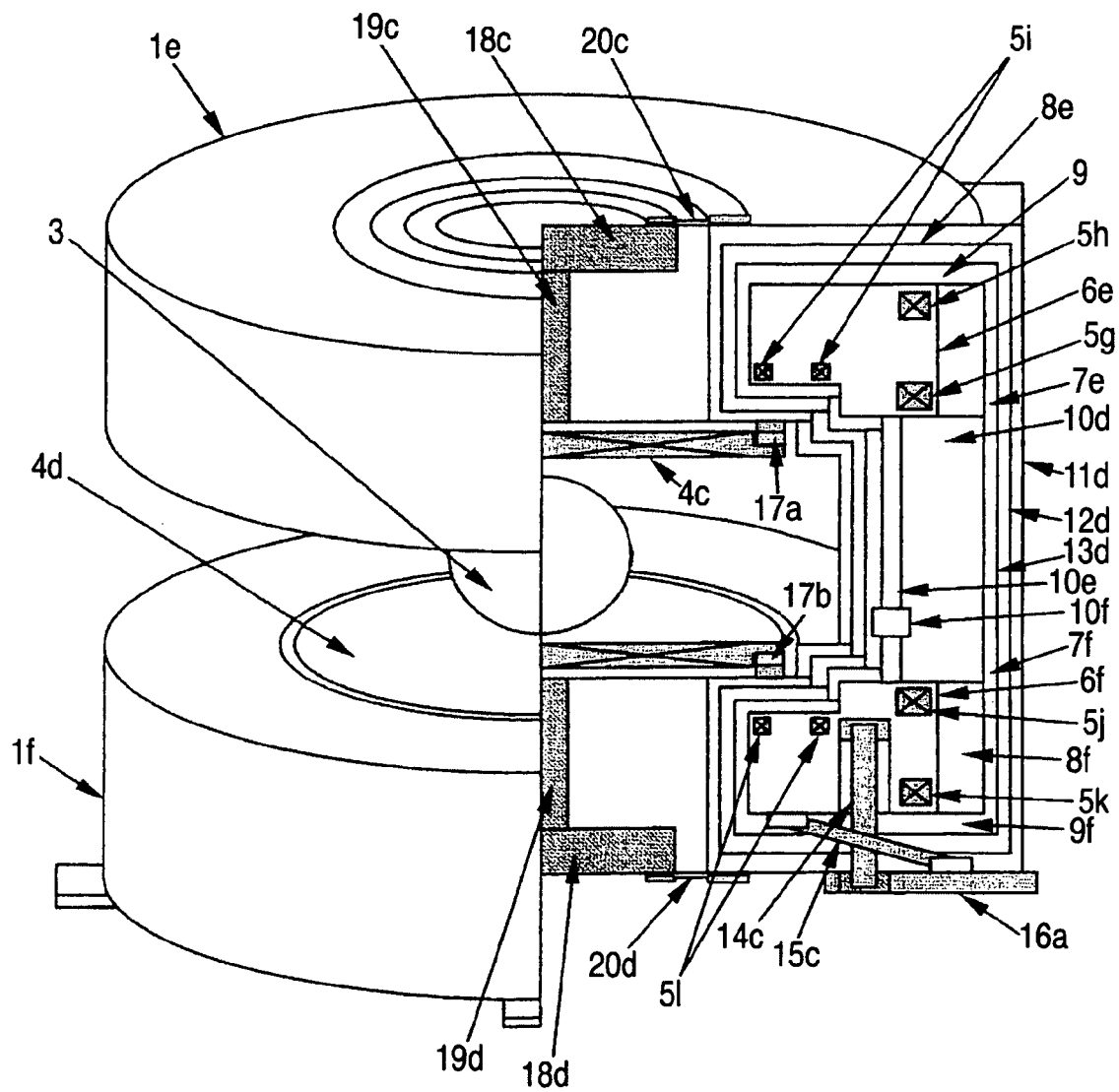
FIG. 12 is a sectional side elevation showing a tenth embodiment of the invention.

Referring to FIG. 12, alpha-numeral 10d denotes a connection portion that connects helium vessels 6e and 6f at the top and the bottom.

The connection portion 10d is a structure that singly supports the both helium vessels 6e and 6f at the top and the bottom.

Alpha-numeral 10e denotes a gas tube that connects the helium vessels 6e and 6f at the top and the bottom, in which a helium gas, liquid helium, current lead wires, and the like pass through.

Alpha-numeral 10f denotes a stress absorbing member comprising a bellows or the like.

Alpha-numerals 7e and 7f denote vacuum vessels at the top and the bottom.

Alpha-numerals 8e and 8f denote heat shields that are provided, respectively, between the helium vessels 6e and 6f and the vacuum vessels 7e and 7f and chiefly block off radiation heat.

Alpha-numerals 9e and 9f denote heat shields that are provided, respectively, between the helium vessels 6e and 6f and the heat shields 8e and 8f and chiefly block off radiation heat.

Alpha-numeral 11d denotes a connection portion that connects the vacuum vessels 7e and 7f.

Alpha-numerals 12d and 13d denote connection portions that connect the heat shields 8e and 8f and the heat shields 9e and 9f, respectively.

The other portions are the same as or equivalent to those of the first through ninth embodiments.

When the helium vessels 6e and 6f at the top and the bottom are connected by means of the pillar 10d having large rigidity as is shown in FIG. 12, it becomes difficult for oscillation to be transmitted in the vertical direction, which can reduce oscillation between the superconducting coils 5g, 5h, and 5i at the top and the superconducting coils 5j, 5k, and 5l at the bottom. The same advantages as those of the first embodiment can be therefore expected.

What is claimed is:

1. A superconducting magnet apparatus for MRI, comprising:

a top superconducting magnet and a bottom superconducting magnet spaced apart from each other with the top superconducting magnet being on top of the bottom superconducting magnet, each of the top and bottom superconducting magnets including a superconducting coil group formed of plural superconducting coils, a helium vessel for accommodating the superconducting coil group, a vacuum vessel for accommodating the helium vessel and providing vacuum insulation by maintaining an interior under vacuum, and a heat shield that is provided in a space between the helium vessel and the vacuum vessel to block off radiation heat from the vacuum vessel;

a connection portion for connecting integrally the top superconducting magnet and the bottom superconducting magnet; and a pair of gradient coils provided, respectively, to opposing inner surfaces of the top superconducting magnet and the bottom superconducting magnet to generate a gradient magnetic field, wherein:

a homogeneous magnetic field and a gradient magnetic field are generated in a space between the top superconducting magnet and the bottom superconducting magnet;

the bottom superconducting magnet is provided with a supporting member for supporting the helium vessel of the bottom superconducting magnet connected integrally to the helium vessel of the top superconducting magnet via the connection portion; and the supporting member is fixed to the helium vessel of the bottom superconducting magnet at one end and to the vacuum vessel of the bottom superconducting magnet at another end, and is fixed to a floor surface in a vicinity of the end fixed to the vacuum vessel.

2. The superconducting magnet apparatus for MRI according to claim 1, wherein:

the supporting member comprises a vertical direction supporting member for supporting the helium vessel against a force in a vertical direction, and a radius direction supporting member for supporting the helium vessel against forces in a radius direction and in a circumferential direction.

3. The superconducting magnet apparatus for MRI according to claim 1, wherein:

concave portions are provided in the opposing inner surfaces of the top superconducting magnet and the bottom superconducting magnet, and the gradient coils are disposed in the concave portions.

4. The superconducting magnet apparatus for MRI according to claim 1, further comprising:

a reattachable top supporting member provided for the helium vessel of the top superconducting magnet.

5. The superconducting magnet apparatus for MRI according to claim 4, wherein:

the top supporting member comprises a vertical direction top supporting member for supporting the helium vessel of the top superconducting magnet against a force in a vertical direction, and a radius direction top supporting member for supporting the helium vessel of the top superconducting magnet against forces in a radius direction and in a circumferential direction.

6. The superconducting magnet apparatus for MRI according to claim 4, further comprising:

a fixing plate for fixing a vacuum vessel side of the top supporting member; and a bellows attached in a space between the fixing plate and the vacuum vessel of the top superconducting magnet to achieve a structure that makes one end of the top supporting member free without breaking a vacuum in the vacuum vessel of the top superconducting magnet.

7. The superconducting magnet apparatus for MRI according to claim 4, further comprising:

a fixing mechanism for fixing a vacuum vessel side of the top supporting member; and an O-ring attached to a space between the fixing mechanism and a portion fixed to the vacuum vessel to achieve a structure that makes one end of the top supporting member free without breaking a vacuum in the vacuum vessel.

8. The superconducting magnet apparatus for MRI according to claim 7, wherein the fixing mechanism is a bolt and a nut.

9. The superconducting magnet apparatus for MRI according to claim 1, wherein:

the connection portion that connects the top superconducting magnet and the bottom superconducting magnet is provided singularly.

10. The superconducting magnet apparatus for MRI according to claim 1, further comprising mass bodies provided in central holes in the top superconducting magnet and the bottom superconducting magnet, and fixed to central portions of the gradient coils, respectively.

11. The superconducting magnet apparatus for MRI according to claim 10, wherein:

end portions of the mass bodies are respectively fixed to the vacuum vessel of the top superconducting magnet and the vacuum vessel of the bottom superconducting magnet via elastic bodies.

12. The superconducting magnet apparatus for MRI according to claim 1, wherein:

the connection portion comprises a connection pillar for connecting the helium vessel of the top superconducting magnet and the helium vessel of the bottom superconducting magnet, and serving as a support against a mass of the top superconducting magnet and electromagnetic forces acting between the helium vessel of the top superconducting magnet and the helium vessel of the bottom superconducting magnet.

13. The superconducting magnet apparatus for MRI according to claim 1, further comprising:

a gas tube for emitting a gas into and discharging a gas from the respective helium vessels of the top and bottom superconducting magnets; and a stress absorbing member provided at a mid point of the gas tube.

14. The superconducting magnet apparatus for MRI according to claim 1, further comprising:

a connection member for connecting the pair of the gradient coils;

a beam structure member for connecting the connection member to the connection portion of the top and bottom superconducting magnets; and a buffer interposed between the beam structure member and the connection portion of the top and bottom superconducting magnets.

15. The superconducting magnet apparatus for MRI according to claim 1, further comprising:

a connection member for connecting the pair of the gradient coils;

a pillar attached to a base of the bottom superconducting magnet; and a beam-shaped member for connection member and the pillar.

16. The superconducting magnet apparatus for MRI according to claim 1, further comprising:

a mass body having a large mass and provided under the bottom superconducting magnet; and a fixing plate of the bottom superconducting magnet connected to the mass body.

* * * * *